United States Patent [19]

Egan

[11] 4,001,713
[45] Jan. 4, 1977

[54] PHASE LOCK LOOP CIRCUIT

[75] Inventor: William F. Egan, Cupertino, Calif.

[73] Assignee: GTE Sylvania Incorporated, Mountain View, Calif.

[22] Filed: Jan. 15, 1976

[21] Appl. No.: 649,421

[52] U.S. Cl. ............................ 331/1 A; 331/25
[51] Int. Cl.² ...................................... H03B 3/04
[58] Field of Search .............. 331/1 A, 11, 12, 18, 331/25

[56] References Cited
UNITED STATES PATENTS 3,813,610   5/1974   Kimura ............................ 331/1 A

*Primary Examiner*—Siegfried H. Grimm
*Attorney, Agent, or Firm*—John F. Lawler

[57] ABSTRACT

A phase locked loop circuit for a controlled oscillator employs a digital phase detector and maintains phase lock between trains of reference (R) pulses and controlled (C) pulses derived from the oscillator. Acquisition of a state of phase lock is aided by delaying or advancing the C-pulse relative to the next occurring R-pulse when the frequency of the C-pulses is higher or lower, respectively, than the R-pulse frequency. A frequency divider connected to the oscillator output is reset once during each cycle to produce C-pulses as an input to the phase detector and the R-pulse input to the phase detector is applied from a reference pulse source through a delay circuit. Logic elements responsive to the two phase detector inputs determine the relative frequencies of the latter and control operation of the frequency divider to either delay or advance the production of the C-pulse relative to the R-pulse without interrupting operation of the R-pulse source.

3 Claims, 2 Drawing Figures

PHASE LOCK LOOP CIRCUIT

BACKGROUND OF THE INVENTION

This invention relates to phase control systems and more particularly to an improved phase locked loop circuit.

In order to maintain a phase locked relationship between controlled (C) and reference (R) signals, the phase control circuit compares phases of these signals and adjusts the controlled frequency relative to the reference frequency. In accordance with prior practice, if the controlled frequency is too high, the C-signal is held or delayed (no phase change) until occurrence of the R-signal or pulse. If the controlled frequency is too low, the R-signal is held (no phase change) until occurrence of the C-signal. A disadvantage of the latter practice of holding the reference signal is the necessity of interrupting operation of the source R-signals. This prevents the use of one reference source for several phase locked loops. Furthermore, this technique may complicate the design of sample-hold type phase detectors because the saw-tooth ramp voltage generator in the phase detector must be held at the upper limit of the operating range whenever a sample pulse (C-signal) does not occur. In addition, when a sample-hold type phase detector is used, if the controlled oscillator frequency becomes too low, oscillation may stop altogether with the output of the phase detector at a value which causes low oscillator frequencies so that the system at worst becomes locked in this condition or at best has a slower response. These disadvantages are overcome in the phase locked loop embodying this invention.

Another problem to which this invention is addressed is negative effect of circuit transients which occur when a pulse in one train passes a pulse in another train as when two normally synchronized pulse trains drift relative to each other. Avoidance of such transients is highly desirable in the operation of phase locked loops since transients tend to slow down or prevent the reacquisition of the lock condition.

OBJECTS AND SUMMARY OF THE INVENTION

A general object of the invention is the provision of a phase locked loop with improved acquisition capabilities which avoids interrupting the operation of the reference signal source so that one such source may be utilized by several loops.

Another object is the provision of a phase locked loop which will not fail to lock if the controlled oscillator stops oscillating due to being tuned too low in frequency.

Another object is the provision of a phase locked loop whose response will not be greatly slowed due to a reduced sampling rate when the controlled oscillator is tuned too low.

Still another object is the provision of such a circuit which quickly reestablishes a phase locked condition between pulse trains without generating undesired transients.

These and other objects of the invention are achieved with a circuit which detects the condition of a low frequency C-pulse train wherein no C-pulse would occur between two successive R-pulses and causes a C-pulse to be produced in advance of the second R-pulse. This is achieved by applying a delayed R-pulse to the phase detector and, when the C-pulse frequency becomes low, applying an undelayed R-pulse to a C-pulse generator to produce a C-pulse prior to the occurrence of the next R-pulse.

DESCRIPTION OF PREFERRED EMBODIMENT

Figure 1:
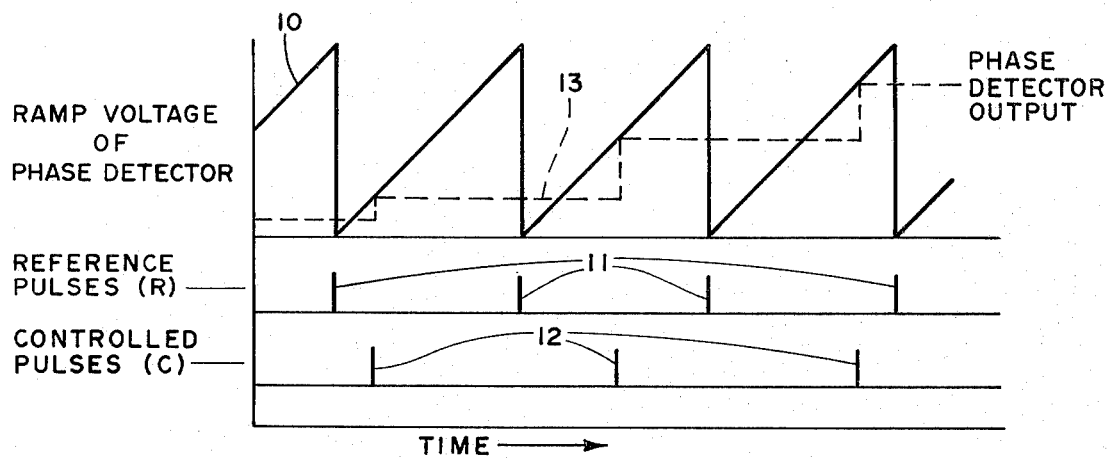
FIG. 1 is a diagram showing the time relationships between the ramp voltage generated by the phase detector and the reference (R) and controlled (C) pulses in a phase locked loop.

Referring now to the drawings, FIG. 1 illustrates waveforms of an elementary sample and hold phase detector circuit. The phase detector generates a ramp voltage represented by the saw-tooth waveform 10 which goes to zero each time a reference or R-pulse 11 occurs. Between R-pulses, the ramp voltage rises linearly to a maximum value. When the controlled or C-pulse 12 occurs, the ramp voltage is sampled and held as indicated by the broken line 13, thus producing the phase detector output. The C-pulses are generated by a pulse generator such as a frequency divider driven by a controlled oscillator, and the C-pulse frequency is proportional to the phase detector output. If the C-pulse frequency is lower than the R-pulse frequency, as shown in FIG. 1, the phase detector output increases as indicated by the dotted line 13 so as to cause the C-pulse frequency to increase through an appropriate feedback network. Conversely, the phase detector output decreases when the C-pulse frequency is higher than the R-pulse frequency.

Figure 2:
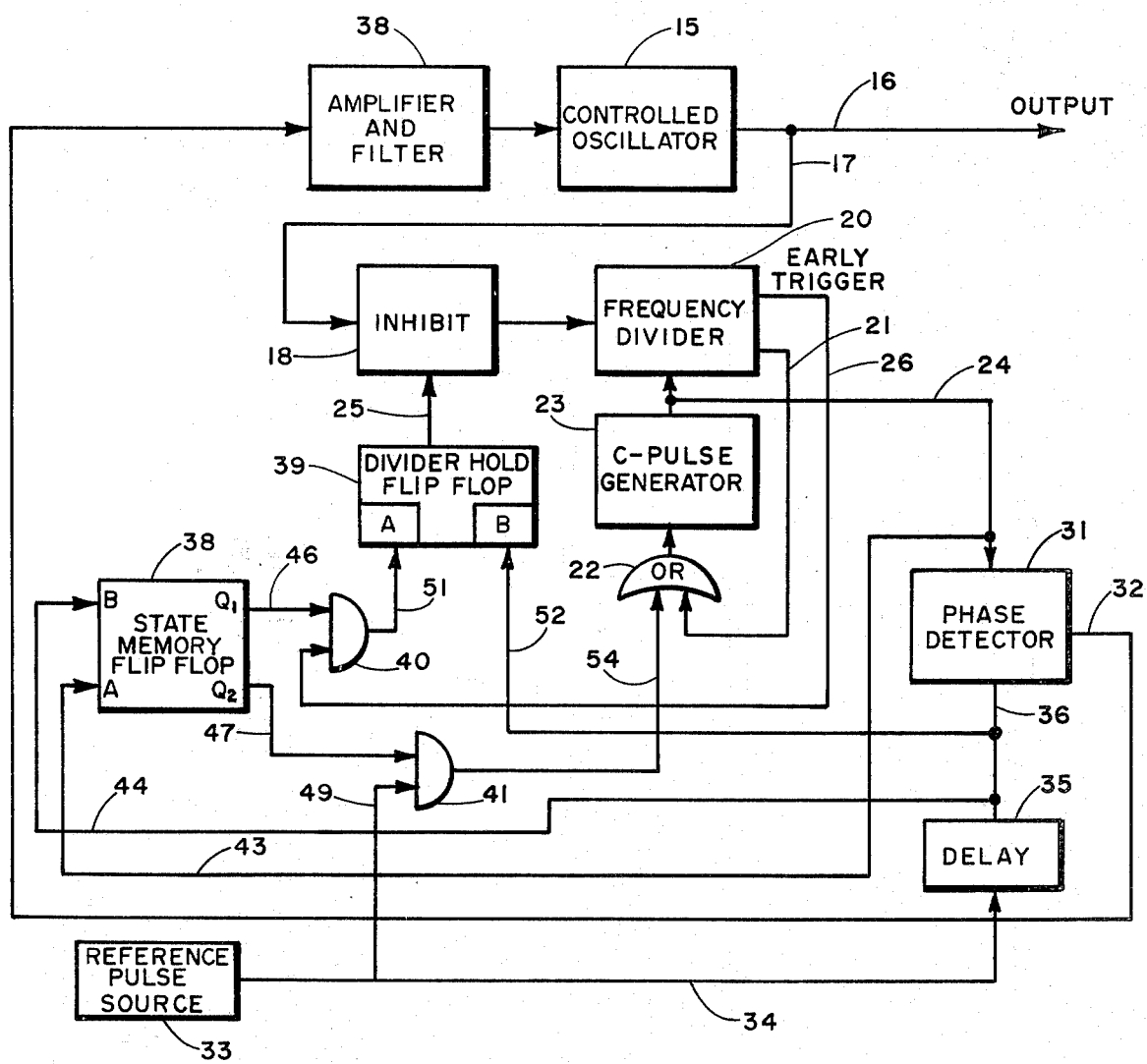
FIG. 2 is a block diagram of a phase locked loop circuit embodying the invention.

Referring to FIG. 2, a phase locked loop circuit embodying this invention is illustrated with a controlled oscillator 15 which produces on line 16 an output signal whose frequency is to be controlled. Line 16 is connected by line 17 to a logical inhibit device 18, the output of which is applied to a frequency divider 20 which generates on one output line 21 a signal applied through OR gate 22 to a C-pulse generator 23 for producing controlled or C-pulses 12 which are applied to frequency divider 20 and to line 24. The frequency of C-pulses 12 is therefore directly proportional to the oscillator frequency.

Inhibit device 18 has a control terminal 25 which, when energized, prevents the signal from passing through the device. When control terminal 25 is not energized, the signal passes through inhibit device 18 and advances the state of frequency divider 20. Each time frequency divider 20 reaches its terminal count a signal is produced on line 21. This signal passes through OR gate 22 to C-pulse generator 23. The C-pulse causes frequency divider 20 to be reset to its initial count. A pulse produced on line 54 as explained below will similarly pass through OR gate 22 and trigger C-pulse generator 23, resetting frequency divider 20. Frequency divider 20 also produces an early trigger signal on output line 26 immediately prior to the normal generation of a signal on line 21. The purpose of the early trigger signal is to prevent the subsequent passage of pulses through inhibit device 18 for a time and thus delay the generation of the C-pulse in cases where the frequency of the latter would otherwise be excessive.

The output of C-pulse generator 23 on line 24 comprises C-pulses 12 which are applied as one input to a digital phase detector 31. The ramp voltage illustrated at 10 in FIG. 1 is generated by phase detector 31 and the value of that voltage at the moment of occurrence of the C-pulse input is the output voltage 13 (FIG. 1) on phase detector output line 32. Reference pulses 11 which reset the ramp voltage to zero are supplied by a source 33 to line 34 which is connected through a delay device 35 and line 36 as the other input to the phase detector. Phase detector 31 preferably is a sample and hold type, similar to the type described at pages 184–187 of the book entitled "Frequency Synthesis" by V. F. Kroupa (Halsted Press: John Wiley, New York, 1973).

The output of phase detector 31 on line 32 is an error voltage representing the difference in phase between C-pulses and delayed R-pulses and is applied to oscillator 15 through a DC amplifier and filter circuit 38 to change the frequency of the oscillator output on line 16.

If the frequency of oscillator 15 exceeds that of the reference pulses, the resulting condition is that two C-pulses would eventually occur between adjacent R-pulses. On the other hand, if the frequency of oscillator 15 is less than the reference pulse frequency, two R-pulses would eventually occur between adjacent C-pulses. In order to detect these conditions and to compensate for the relative frequency errors which cause them, logic circuitry is provided and comprises a state memory flip-flop device 38, a divider hold flip-flop device 39 and AND gates 40 and 41.

State memory device 38 has terminals A and B connected by lines 43 and 44, respectively, to phase detector input lines 24 and 36, respectively. Terminals A and B are the set and reset inputs, respectively, to the device 38 and therefore a C-pulse on line 24 sets the device and an R-pulse on line 36 resets it. When device 38 is set, it produces an output at $Q_1$ to line 46 which is connected as one input to AND gate 40. An R-pulse input to terminal B of device 38 resets it, thereby producing an output at terminal $Q_2$ for application on line 47 as one input to AND gate 41. A second input to gate 40 is the early trigger signal from frequency divider 20 on line 26. The second input to gate 41 is on line 49 connected to line 34 which provides reference pulses that are undelayed as compared to the delayed pulses on input line 36 of phase detector 31.

The output from AND gate 40 on line 51 is applied to the set terminal A of divider hold flip-flop device 39 and delayed reference pulses from line 36 are connected by line 52 to the reset terminal B of the same device. Control terminal 25 of inhibit device 18 is connected to the output of device 39. When device 39 is set by an output from AND gate 40, control terminal 25 is energized, causing inhibit device 18 to prevent the output of oscillator 15 from reaching frequency divider 20. When device 39 is reset by a delayed R-pulse on line 52, control terminal 25 is de-energized so that the output of oscillator 15 reaches frequency divider 20.

The output of AND gate 41 is applied on line 54 to OR gate 22 for application to C-pulse generator 23, placing a reset pulse on the control terminal of frequency divider 20. Thus an output signal from AND gate 41 causes frequency divider 20 to reset and generates a C-pulse.

In operation, assume an increase in the frequency of oscillator 15 so that two successive C-pulses would occur between two adjacent R-pulses. In this case, the logic circuit functions so as to delay the second C-pulse until immediately after the second R-pulse. This is accomplished as follows: The first pulse on C-pulse generator output line 24 is applied on line 43 to set terminal A of state memory flip-flop 38. This produces an output at $Q_1$ and on line 46 to gate 40. An early trigger signal on line 26 from the frequency divider 20 appears immediately prior to the time when the second C-pulse would normally occur (in the absence of the logic circuitry) and is applied as the second input to gate 40. This produces an output on line 51 to "set" terminal A of divider hold flip-flop 39 so as to energize control terminal 25 of inhibit device 18. The output of the oscillator on line 17 is prevented from reaching frequency divider 20 and this prevents generation of the second C-pulse until divider hold flip-flop 39 is reset by the next R-pulse on line 52. When divider hold device 39 is so reset, inhibit terminal 25 is de-energized permitting the second C-pulse to be generated but only immediately after the R-pulse.

It will be noted that since the delayed C-pulse occurs immediately after the R-pulse, the value of the ramp voltage (FIG. 1) is very small or nearly zero. Consequently, the value of the phase detector output on line 32 decreases so as to induce a reduction in the frequency of oscillator 15.

The above described technique for delaying the C-pulse until the next R-pulse has occurred has been practiced in prior art circuits and does not per se constitute this invention.

Assume that the controlled oscillator output frequency decreases such that no C-pulse would occur between adjacent R-pulses. In accordance with this invention, the C-pulse is forced to occur just prior to the R-pulse so as to sample the ramp voltage at its near maximum value and produce maximum phase detector output to increase the C-pulse frequency. When the first R-pulse occurs, state memory device 38 is reset by the R-pulse on line 44. This produces an output at terminal $Q_2$ which is applied by line 47 as one input to AND gate 41. Prior to the application of a delayed R-pulse to the phase detector on line 36, the undelayed R-pulse on line 34 occurs and is applied by line 49 as the second input to gate 41. This produces a gate output on line 54 which is applied through OR gate 22 and C-pulse generator 23 to reset frequency divider 20 and through line 24 to provide a C-pulse to the phase detector. Immediately thereafter, i.e., a period corresponding to the delay characteristic of device 35, the R-pulse is applied to the phase detector. Thus a "forced" C-pulse is applied on line 24 to the phase detector prior to the R-pulse, producing a large detector output on line 32 tending to increase the frequency of oscillator 15. The two pulse trains are thus brought into phase lock in a highly efficient manner without affecting the operation of reference pulse source 33.

Changes may be made to the above described embodiment without departing from scope of the invention. For example, two synchronized reference pulse trains shifted relatively in time may be generated to supply the delayed and undelayed R-pulses, respectively. Also, the timing parameter of the above described circuit may be changed so as to substantially increase the slope of the saw-tooth ramp so as to limit the phase detection range to a fraction of a cycle and achieve a corresponding reduction of phase noise. In this case, the sample occurs at the top of the ramp and prior to the R-pulse although not immediately prior thereto.

What is claimed is:

1. A phase lock circuit for an oscillator having an output comprising pulse generator means responsive to the output of said oscillator for producing controlled (C) pulses, a phase detector having one input connected to the output of said pulse generator means, a source of reference (R) pulses, means for producing delayed R-pulses and applying same to said phase detector whereby the phase detector compares C-pulses and delayed R-pulses and produces an output corresponding to phase differences therebetween, means to connect said output of the phase detector to said oscillator to correct changes in frequency of the latter relative to the frequency of said R-pulses, means responsive to said C-pulses and to said delayed R-pulses for temporarily disconnecting the output of said oscillator from said pulse generator means when the C-pulse frequency is greater than said R-pulse frequency whereby to cause the second of two successive C-pulses that would occur prior to an R-pulse to occur immediately after the R-pulse, and means responsive to said R-pulses for advancing the phase of the C-pulses when the C-pulse frequency is lower than said R-pulse frequency whereby to cause the second of two successive R-pulses that would occur without an intermediate C-pulse to be preceded by a C-pulse.

2. A phase locked loop circuit comprising a controlled oscillator having an output, a pulse generator responsive to the output of said oscillator for converting the oscillator output to a train of controlled (C) pulses, a source of reference voltage (R) pulses, a digital phase detector having first and second inputs and an output, means for connecting the output of said generator to the first input of said detector, means for producing delayed R-pulses and applying same to the second input of said detector, means for connecting the output of said detector to said oscillator whereby to cause the frequency of the oscillator to track the frequency of said source, inhibit means connecting said oscillator output to said pulse generator and having a control terminal, and logic means connected to said control terminal and to said generator and being responsive to the inputs to said detector for producing an output to said control terminal for inhibiting the input to said generator when two successive C-pulses would occur without an intervening delayed R-pulse and for producing an output to said generator for advancing the generation of a C-pulse from said generator when two successive delayed R-pulses would occur without an intervening C-pulse.

3. The circuit according to claim 2 in which said logic means comprises state memory means having first and second outputs produced alternately by successive occurrences of C-pulses and delayed R-pulses, respectively, and gate means responsive to the second output of said state memory means and to the output of said reference frequency source for producing an output when the next successive pulse after a delayed reference pulse is an undelayed R-pulse, said generator being responsive to the output of said gate means for producing a C-pulse immediately prior to said delayed R-pulse.

* * * * *